United States Patent

Nakanishi

[15] 3,662,271

[45] May 9, 1972

[54] SOLID STATE TELEVISION TUNER

[72] Inventor: Mutsuo Nakanishi, Villa Park, Ill.

[73] Assignee: Standard Kollsman Industries, Inc., Melrose Park, Ill.

[22] Filed: July 7, 1969

[21] Appl. No.: 839,168

[52] U.S. Cl. ..............................325/459, 325/465, 334/14

[51] Int. Cl. ..............................H04b 1/16, H03j 5/00

[58] Field of Search ..............325/452, 457, 459, 461, 462, 325/464, 465, 468; 334/14

[56] References Cited

UNITED STATES PATENTS

| | | | |
|---|---|---|---|
| 3,544,903 | 12/1970 | Sakamoto | 325/459 |
| 3,333,202 | 7/1967 | Valdettaro | 325/465 X |
| 2,873,360 | 2/1959 | Lyman | 325/461 |
| 3,548,315 | 12/1970 | Lehmann et al. | 325/461 X |

*Primary Examiner*—Richard Murray

*Attorney*—E. Manning Giles, J. Patrick Cagney and Peter S. Lucyshyn

[57] ABSTRACT

A UHF-VHF all channel television tuning system including a solid state voltage-variable capacitor (varactor) tuned VHF television tuner in five embodiments is disclosed. The first VHF tuner is a three matched tuned circuit tuner including one varactor tuned preselector circuit, one varactor tuned RF amplifier load circuit and one varactor tuned oscillator circuit. Each of the three varactors of the three tuned circuits are controlled from a single voltage source and each of the tuned circuits has provisions for solid state switching between the lower and upper VHF bands so that the same voltage source can tune both VHF bands.

The VHF tuner includes four stages: a first RF amplifier stage, an IF amplifier stage, a mixer stage and an oscillator stage. Provisions are made for employing the IF amplifier stage and the mixer stage as cascaded IF amplifier stages when receiving a UHF television signal, with the same IF output terminal yielding signal outputs for both UHF and VHF modes of operation. Provision is also made for automatically alternating the gain of the cascaded amplifiers between the UHF and VHF modes to obtain a parity between the modulated IF outputs in both modes.

Also disclosed are four alternative embodiments of the VHF tuner of the invention; one in which two inductively coupled IF filter circuits are provided between the mixer stage and the amplifier stage to reduce noise and cross-modulation, a second in which a field effect transistor (FET) is provided as the IF amplifier stages amplifying device for the same end and a third which is a three circuit three stage VHF tuner without provision for UHF signal accommodation. The fifth embodiment is a four tuned circuit VHF tuner capable of use in the system, which tuner includes a varactor tuned preselector circuit, a varactor double tuned interstage circuit and an oscillator varactor tuner circuit as well as IF amplifier stage that is employed for both UHF and VHF modes of operation and provision for altering the gain of the mixer and IF amplifier stages between UHF and VHF modes of operation to achieve parity between UHF and VHF IF outputs.

15 Claims, 8 Drawing Figures

Inventor
Mutsuo Nakanishi
By Richard G. Kinney Atty.

Inventor
Mutsuo Nakanishi
By
Richard G. Kinney
ATTY.

SOLID STATE TELEVISION TUNER

The present invention is directed to a solid state tuned television tuning system for both VHF and UHF bands in which a portion of the circuitry of the VHF tuner is used in both modes which circuitry automatically varies its operation depending upon the mode, UHF or VHF, in which the system is operated. The present invention is also concerned with provision of a novel VHF tuner of the varactor tuned type.

Heretofore, the only commercial solid state or varactor tuners have been built in Europe for European standards and have at least four tuned circuits. So far, these tuners have not proven practical in the United States or Canada.

The present invention provides the first known three matched tuned circuit tuner employing only three solid state voltage variable capacitors. As such it comprises an improvement over the circuits disclosed in the U.S. Pat. No. 3,354,397 which issued on Nov. 21, 1967 in the name of Karl Heinz Wittig and is entitled "Voltage-Variable Diode Capacitance Tunable Circuit for Television Apparatus" and assigned to the assignee of the present invention. The present three matched tuned circuit tuner has several advantages over the Wittig circuits including exhibiting better tracking over the frequency bands, less noise, greater gain and also being more economical to make. In addition, the present VHF tuner facilitates construction of an all-wave (VHF–UHF) tuning system.

The television tuning system of the present invention may be employed with a conventional UHF tuner but is preferably to be used with the varactor tuned UHF tuner claimed and disclosed in the coincidentally filed co-pending application of Gert Manicki for U.S. Ser. No. 839,169, which is entitled "-Solid State Tuned UHF Television Tuner" and is assigned to the assignee of the present invention.

It is also preferred that the systems employ as a component part the type of switching and control unit disclosed in the co-pending application for U.S. letters patent Ser. No. 839,167, filed coincidentally herewith in the names of Edward L. Midgley and Reuben C. Carlson, entitled "Solid State Tuners" and assigned to the same assignee as the present invention.

The tuning system of the present invention provides for translation and amplification of the UHF derived modulated intermediate frequency (IF) signal by the VHF tuner and thus merges the two types of tuners to an extent heretofore not employed. One advantage of the present tuner is the use of cascaded amplifier in both UHF and VHF modes of operation. The result of this merger is the use of VHF circuitry for double duty and the provision of a single intermediate frequency output terminal for both the UHF and VHF modes of operation. It also allows for a further economy of parts in the system and simpler assembly of the entire system.

Unique and economical provisions are incorporated in the system for automatically adjusting the condition of the VHF tuner circuitry employed during the UHF mode of operation to achieve a parity between the output signals during both modes of operation.

The features of the present invention also allow for a great economy of parts and labor in achieving an economy VHF varactor tuner with high quality features. One such feature is the provision of a three inductor coupling transformer which couples a varactor tuned circuit, the radio frequency amplifier device and the mixer stage.

BRIEF DESCRIPTION OF THE DRAWINGS

The features of this invention which are believed to be novel are set forth with particularity in the appended claims. The invention, together with further features and advantages thereof, may best be understood, however, by reference to the following description taken in conjunction with the accompanying drawings, in the figures of which the numerals identify like elements and in which:

Referring to FIG. 1, there is depicted an all-channel television tuner system generally designated 9 which includes a VHF television tuner which is generally designated by the numeral 10, and a UHF tuner 12 represented in block form, together with associated circuitry. The VHF tuner 10 is housed in a manner generally similar to that shown in the aforementioned Wittig patent, or as illustrated herein in FIGS. 6A, 6B, and 6C, that is, primarily in a closed and compartmentalized housing with some elements mounted on the outside of the housing. The housing is made of electrically conductive material, preferably metal, and is schematically indicated in FIG. 1 by the line 11. Most of the parts and circuit elements of the VHF tuner 10 are housed within the housing, and, generally, these elements are depicted above the ground or housing line 11 in FIG. 1. Conventionally the housing 11 of the tuner is electrically connected to the chassis of the television receiver which may or may not be connected to the earth or natural "ground" potential. Thus, the term ground herein should be understood as referring to the reference potential level rather than earth potential.

Figure 1:
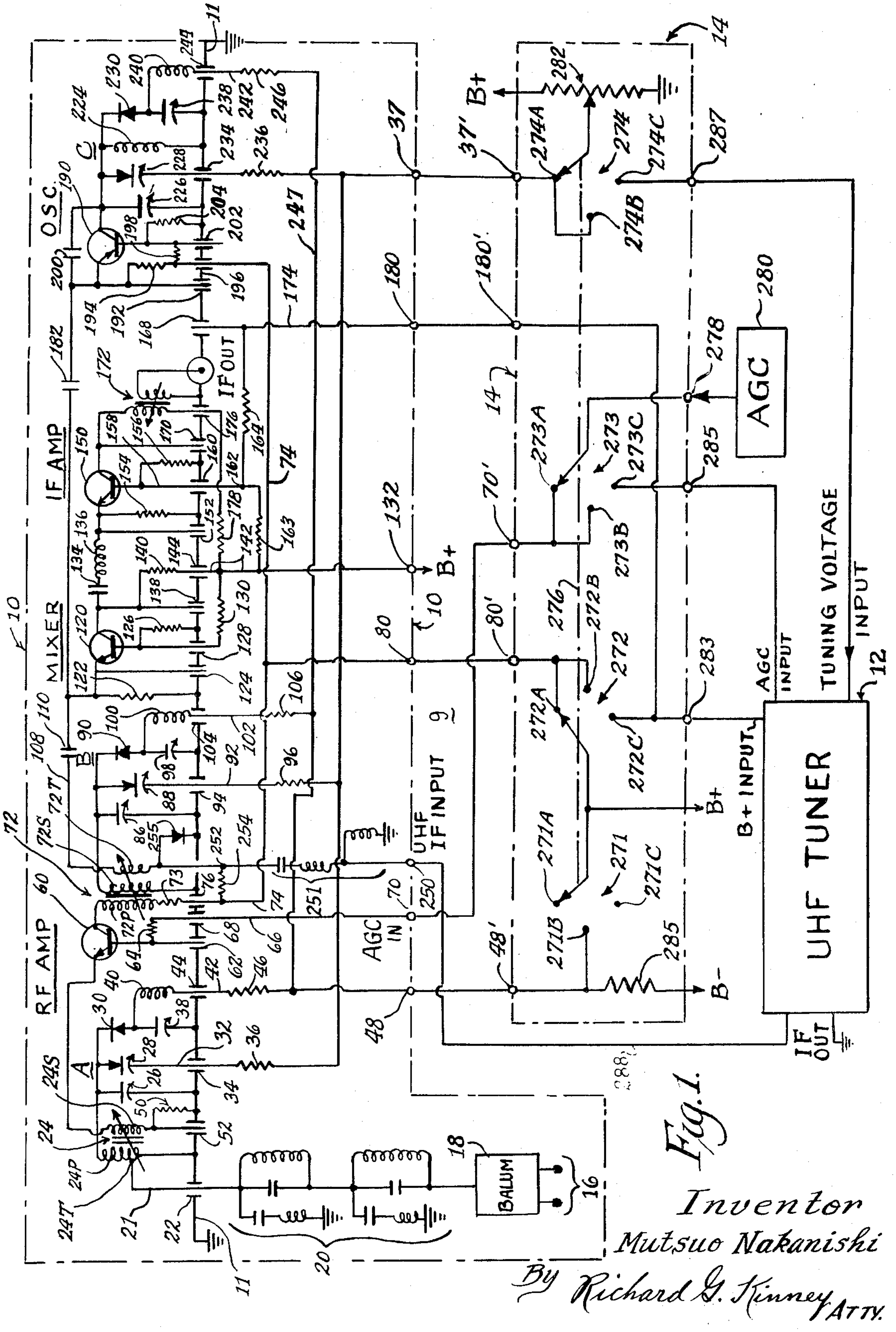
FIG. 1 is a circuit diagram partly in block form of an all channel television tuning system, including a VHF television tuner for selecting, translating and converting a received television signal into a modulated IF signal of a predetermined amplitude range, embodying the present invention.

The UHF tuner 12 is preferably of the type disclosed in the aforementioned application of Gert Manicki, that is, a varactor controlled UHF tuner. However, with slight modification of the circuit of FIG. 1 any other type of UHF tuner could be employed.

Connected between the VHF tuner 10 and UHF tuner 12 is a channel selector control unit 14 preferably of the type described in the aforesaid Midgley, et al. application.

More specifically, the VHF tuner 10 includes a pair of VHF antenna input terminals 16 connected to an impedance matching transformer or balum 18. The radio frequency signals picked up by the antenna are developed between the output of the balum 18 and a plane of reference potential or ground. The potential of the housing 11 will be taken herein as the reference or ground potential. These signals are passed through a circuit generally designated 20 which includes traps for signals in the FM band (approximately 88 to 108 mhz) and of the intermediate frequency range (conventionally approximately 41.25 mhz to 45.75 mhz, the conventional IF carrier frequencies) of the tuner 10. The received VHF signals are fed into the interior of the housing of the tuner 10 via a conductor 21 which passes through and is in part the center line of a feedthrough capacitor 22, to a preselector tuned circuit generally designated by the letter A.

The feedthrough capacitor is a three terminal device that is well known in the tuner art. It includes a central or feedthrough conductor surrounded by dielectric material and an outermost conductive hollow cylinder. It is normally mounted through the grounded housing with the cylinder connected thereto and thus represents a capacitance to ground.

This tuned circuit A includes a first transformer 24 which has a primary coil 24P and a secondary coil 24S. The primary coil 24P has an intermediate tap 24T to which is connected VHF signal line 21. The transformer 24 includes a movable magnetic material core whereby the inductance and mutual coupling of its coils 24P and 24S may be varied. One end of the coil 24P is grounded while the other end is connected in common with one side of a trimmer capacitor 26, with the anode of a solid state voltage-variable capacitance 28 which preferably is a diode or varactor, and also with the cathode of a solid state means for switching 30, which is preferably a diode.

As used herein with respect to diodes the terms anode and cathode are applied respectively, to terminals from which and to which conventional electric current would flow with the least resistance. It should be noted, however, that varactors are normally back-biased and both the varactors and the switching diodes are semiconductor devices.

The other side of the trimmer capacitor 26 is grounded. The cathode of the varactor 28 is connected through a conductor line 32 which passes through as the central conductor feedthrough capacitor 34, to one end of a resistor 36. The resistor 36 is mounted without the housing 11. The other end of resistor 36 is connected to a tuning voltage input terminal 37. The effective value of the capacitance exhibited by the varactor diode 28 depends on the level of direct current voltage impressed at the terminal 37.

The anode of the diode 30 is connected through a trimmer capacitor 38 to ground and also to one end of an inductance coil 40. The other end of the coil 40 is connected to a conductor, line 42, which passes without the housing through a feedthrough capacitor 44, where it is connected to one end of a resistor 46. The resistor 46 is mounted outside of the housing 11. The other end of the resistor 46 is connected to a switching voltage input terminal 48. Depending upon the voltage present at the input terminal 48 the diode 30 may be either forward or reverse biased in which case the inductor 40 and capacitors 38 and 44 are effectively either electrically in the circuit or out of the circuit.

The secondary coil 24S of the transformer 24 has one end connected through a resistor 50 to ground and also to one side of a capacitor 52 whose other side is connected to ground. In this case the capacitor is, as depicted in FIG. 1, a feedthrough capacitor used as a two terminal device. This particular type of capacitor is employed as a convenience of construction of the physical tuner, but other types of capacitors might be employed, if it were found convenient. For instance, in a printed circuit version of the tuner 10, it might be more convenient to use a conventional capacitor.

The other end of secondary coil 24S is connected to the emitter of the NPN radio frequency transistor 60. The transistor 60 is the amplifying device of a radio frequency amplifier which amplifies the VHF signals emphasized or preselected by the preselector circuit A and impressed on its emitter from the secondary coil 24S. This radio frequency amplifier section including the transistor 60 and the tuner circuit A is generally designated RF AMP in FIG. 1.

The transistor 60 is operated in the grounded base configuration with its base connected to radio frequency ground through a capacitor 62, again of the feedthrough type used as a two terminal capacitor. The gain of the RF amplifier is controlled by a direct current bias applied to the base of the transistor 60 through a blocking resistor 64 which has one end connected to the base and its other end connected to a conductor 66 which passes without the housing of the tuner 10 through a feedthrough capacitor 68. Without the housing 11 the conductor 66 is connected to an automatic gain control (AGC) voltage input terminal 70.

The provision for AGC is, strictly speaking, an unnecessary but generally desirable feature of a television tuner. If desired to be eliminated, the feedthrough capacitor 68 can be eliminated and a proper bias-establishing resistance circuit substituted.

The collector of the transistor 60 is connected to one end of an inductance coil 72P which is the primary coil of a movable core variable transformer 72. The other end of the primary coil 72P is connected through a current limiting resistor 73 to a conductor, line 74, which passes without the housing of the tuner 10 through a feedthrough capacitor 76. The line 74 is electrically connected to a first positive direct current bias input terminal 80.

The transformer 72 has two secondary coils, a first, relatively large, secondary inductance coil 72S and a second, relatively smaller, inductance coil 72T. The coil 72S has one end grounded and its other end connected in common with one end of a trimmer capacitor 86, the anode of a voltage-variable solid state capacitor 88 which is in this case a capacitance diode or varactor 88, and to one side the cathode of a switching diode 90 or solid state means for switching. These elements form part of a second or interstage tuned circuit generally designated by the letter B. This circuit is connected in essentially the same manner as the tuned circuit A, that is, the other side of the trimmer capacitor 86 is grounded, the cathode of the varactor 88 is connected to a line 92 through a feedthrough capacitor 94 to one end of a current limiting or blocking resistor 96 whose other end is electrically connected to the tuning voltage input terminal 37. Also, the anode of the diode 90 is connected through a trimmer capacitor 98 to ground and also to one end of an inductance coil 100. The other end of the coil 100 is connected to a line 102 which passes through a feedthrough capacitor 104 to one end of a resistor 106 mounted outside of the housing The other end of the resistor 106 is connected to the terminal 48.

The output of the RF AMP stage which includes the input circuit A, the transistor 60 and the load tuned circuit B is connected to a mixer circuit, generally designated MIXER in FIG. 1, from one end of the second secondary inductor 72T via a conductor, line 108, through a capacitor 110 to the emitter of a mixer NPN transistor 120.

The mixer transistor 120 has its emitter further connected through a biasing resistor 122 to ground and also through capacitor 124 to ground. The capacitor 124 may be of the feedthrough type. The base of transistor 120 is connected through a first resistor 126 to ground and through a feedthrough capacitor 128 to one side of a second resistor 130 mounted outside the housing 11. The other side of the resistor 130 is connected to a second positive direct current bias potential input terminal 132. The terminal 132 is connected permanently to any convenient source of such potential.

The collector of the mixer transistor 120 is connected through a filter circuit including series connected capacitor 134 and inductor 136 to the emitter of an IF amplifier NPN transistor 150. This transistor 150 with its associated circuitry forms an intermediate frequency amplifier stage, which is generally designated IF AMP in FIG. 1.

The collector of the transistor 120 is also connected to ground through a capacitor 138 and to the B+ input terminal 132, through a resistor 140 and a line 142 which passes through the housing via a feedthrough capacitor 144.

The IF amplifier transistor 150 has its emitter connected to ground through the parallel connection of a capacitor 152 and a resistor 154. Its base is connected through a resistor 156 to ground and through a line 158 which passes through a feedthrough capacitor 160 to a junction 162 between two branch connected resistors 163 and 164 mounted outside of the housing. The resistor 163 is connected between line 142 and thus the B+ input 132 and the junction 162. The resistor 164 is connected between that junction 162 and a line 174. The line 174 is connected to a second B+ input terminal 180 and also through a capacitor 168 to ground. The capacitor 168 may be of the feedthrough type used as a two terminal device and is of such a value so as to serve as a high frequency ground and thus prevent the unwanted feeding of IF or RF signals out through the DC voltage input terminal 180.

The collector of the IF amplifier transistor 150 is connected to ground through capacitor 170 which may be of the feedthrough type, and is also connected to one end of the primary coil of a movable core transformer 172. The other end of this primary coil is connected through a feedthrough capacitor 176 to ground and through a resistor 178 mounted outside the housing 11 to the line 142 and thus to the permanent B+ input terminal 132.

The secondary coil of the transformer 172 has one end grounded and the other end connected to the intermediate frequency output terminal, IF OUT.

The mixer stage transistor 120 also has a signal impressed in its emitter from an oscillator stage, OSC. This oscillator signal is coupled through a DC blocking capacitor 182 from the emitter of a PNP transistor 190. The emitter of the oscillator transistor 190 is also connected through a capacitor 192 to ground. To establish its operating bias, it is also connected through a resistor 194 and a feedthrough capacitor 196 to ground and through the center conductor of the feedthrough capacitor 196 to the line 74 without of the housing 11 and thus to the first B+ input terminal 80.

Also, connected to the junction between the resistor 194 and the capacitor 196, is one end of a resistor 198 whose other end is connected to the base of the transistor 190. The base of this transistor is also connected to ground through the parallel circuit connection of a capacitor 202 and a resistor 204. The capacitors 196 and 202 are preferably of the feedthrough type and of such a capacitance as to effectively ground signals of the oscillatory frequencies.

A feedback capacitor 200 is provided connected between the emitter and collector of the oscillator transistor 190. Also connected to the collector is the oscillator's frequency determining tuned circuit C. This circuit includes a trimmer capacitor 226 connected between the collector and ground, and a solid state voltage variable capacitance 228 which is also preferably of the varactor type and whose cathode is connected through a feedthrough capacitor 234 to ground and through the housing 11 to one end of a resistor 236 mounted outside the housing 11. The other end of this resistor 236 is connected to the tuning voltage input terminal 37.

Also provided as part of the circuit C is an inductor 224 connected between the collector of the transistor 190 and ground. The cathode of a diode 230 is connected to the collector of the oscillator transistor 190. The anode of this diode 230 is connected through a trimmer capacitor 238 to ground and is also connected to one end of a second inductor 240. The other end of this coil 240 is connected to a conductor, line 242, which passes through the housing as the center conductor of a feedthrough capacitor 244 and is connected to one end of a resistor 246 mounted outside the housing. The other end of this resistor 246 is connected via a line 247 to the switching voltage input terminal 48.

Further provided in the tuner 10 are means for accepting a UHF derived intermediate frequency signal, which means includes a UHF IF input terminal 250 (also designated UHF IF INPUT) which is connected through an intermediate frequency band pass filter circuit generally designated 251 to a junction point 252. This point 252 is connected through a resistor 254 mounted outside the housing to the bias line 74 and also via an opening in the housing to the bottom end of the second secondary coil 72T of the transformer 72. This junction is further connected within the housing to the anode of a diode 255 whose cathode is grounded.

During the VHF mode of operation, the diode 255 is biased into conduction and thus grounds the bottom of the coil 72T.

It might be noted here that structurally the tuned circuits A, B, and C are quite similar. They are in fact electrical homogenes of one another so that they exhibit similar responses to changes in operating conditions and thus "track" well one with another. While the circuits may have different circuit component values (especially the oscillator tuned circuit C) their electric structural similarity greatly increases the efficiency and effectiveness of the VHF tuner.

Before taking up, in detail, the operation of the VHF Tuner 10, its interrelation with and connection to the UHF tuner 12 and the control unit 14 will be considered.

The unit 14 which, as mentioned before, is preferably constructed as disclosed in the aforementioned Midgley et al. application, is functionally depicted in FIG. 1. That is, it includes a switching function that is equivalent in output to the unit 14, but reference should be had to the Midgley et al. application for a preferred embodiment for this functional unit.

The unit 14 includes four three-terminal switches 271, 272, 273 and 274 whose switch blades are ganged together as symbolized by the dashed line 276. The switch blades of the switches 271 and 272 are connected to a source of positive direct current potential B+, while the blade of the third switch 273 is connected to an AGC input terminal 278 for coupling to the AGC source 280 in the television set. When constructed for use in a television set without provision for this AGC source 280 the third switch 273 and its interconnection may be eliminated without interfering with the functioning of the remainder of the system. The switch blade of the fourth switch 274 is connected to a variable source of direct current voltage 282 which may be a variable tap on a resistor connected between a source of positive direct current potential B+ and ground. This variable source is the tuning voltage source for tuning the varactor tuned circuits A, B and C.

The switches 271, 272, 273 and 274 are ganged so that their switch blades each make contact with their respective first contact points (designated 271A, 272A, etc.,) and then sequentially all make contact with their second contact points (271B, 272B, etc.,) and then their third contact points (271C, 272C, etc.,).

For the first position, the first switch 271 has its first contact point 271A electrically unconnected, the second switch's first contact point 272A is connected to a first B+ output terminal 80' which is connected to the input terminal 80 of the VHF tuner 10. The first contact point 273A of the third switch 273 is connected to a first AGC output terminal 70' which is in turn connected to the AGC input terminal 70 of the VHF tuner 10. The first contact terminal 274A of the fourth switch 274 is connected to a first tuning voltage output terminal 37' which is in turn connected to the tuning voltage input terminal 37 of the VHF tuner 10. The first bias potential input terminal 48 of the tuner 10 is connected to a bias output terminal 48' of the unit 14 which in turn is connected through a large resistor 285 to a source of negative direct current potential B–.

Also another output terminal 180' of the unit 14 is connected to bias source input terminal 180 of the VHF tuner 10, but is not connected to any switch blade when the blades are in their first position and thus no potential is applied from this terminal.

Thus, with the ganged switch blades of the unit 14 in their first position a negative bias is applied to input terminal 48, a positive B+ is applied to terminal 80, and AGC signal is applied to terminal 70, no potential is applied to input terminal 180 and a tuning voltage is applied to the tuning voltage input terminals 37.

The second contact terminals of the switches 271–274 are respectively connected to terminal 48', terminal 80', terminal 70' and terminal 37'. Thus, with the exception of the input to terminal 48 the inputs to the tuner 10 are unchanged. The input to terminal 48 is changed from a negative bias to a positive bias.

The third set of contact terminals 271C–274C of the switches 271–274 are, respectively, electrically unconnected to any operational circuit; connected to both the output terminal 180' of the unit 14 and to an output terminal 283 of the unit 14; connected to an output terminal 285 of the unit 14; and connected to an output terminal 287 of the unit 14. The output terminal 283 is a B+ output terminal and is connected to the B+ input, B+ INPUT, of the UHF tuner 12, the output terminal 285 is an AGC output and is connected to the automatic gain control input, AGC INPUT, of the tuner 12 while the output terminal 287 is a tuning voltage output terminal and is connected to the input terminal for tuning voltage, TUNING VOLTAGE INPUT, of the UHF tuner 12.

The UHF tuner 12 has an intermediate frequency output terminal IF OUT which is coupled via a line 288 to the UHF IF INPUT terminal 250 of the VHF tuner 10.

Thus, with the switch blades of the four switches 271–274 in their third positive B+ is cut off from the terminal 48' and a negative potential is applied thereto, positive potential is also cut off from the input 80 of the VHF tuner 10 and applied instead to the B+ input of the UHF tuner, the AGC signal from source 280 is removed from the AGC input terminal 70 of the VHF tuner 10 and instead applied to the UHF tuner 12 and the tuning voltage is removed from the input terminal 37 of the VHF tuner and applied instead to the UHF tuner 12. In addition, the positive bias potential B+ is applied through output 180' of the unit 14 to the input 180 of the VHF tuner 10. The bias input terminal 132 of the VHF tuner 10 remains connected to a positive bias source B+.

OPERATION

Having described in detail the all wave television tuner system of FIG. 1, its operation will not be explained. In overall operation the system produces a signal at the IF OUT terminal comprising predetermined intermediate frequency (commonly from about 41.25 to about 45.75 mhz.) signals of a predetermined amplitude range modulated with the same information contained on a VHF or UHF television channel selected by the setting of the unit 14. The system can thus tune any one of the 12 VHF channels that may be impressed on the VHF antenna input terminals 16 or any of the 80 UHF channels picked up by the UHF antenna (not shown) and coupled to the UHF tuner 12.

As stated before, there are two VHF sub-bands, a lower band of channels 2–6 and a higher band of channels 7–13. We will take up the operation of the system of FIG. 1 first with respect to the lower VHF band, then the higher VHF band and lastly with respect to the UHF band.

THE LOWER VHF BAND

In this mode of operation the ganged switch blades of the switches 271–274 are in their first positions, making contact with their first contact terminals 271A–274A. With this arrangement a negative bias is applied from the B− source through the large current limiting resistance 284 the terminals 48' to the VHF tuner 10 input terminal 48 through the resistor 46 and coil 40 to the anode of the diode 30. This back-biases this diode and effectively removes (for electric circuit analysis) the coil 40, trimmer capacitor 38 and feedthrough capacitor 44 from the tuned circuit A. Through similar paths (resistor 106–coil 100 and resistor 242–coil 240) this negative bias is applied to the anodes of the diodes 90 and 230 to similarly electrically remove the analogous portions from the tuned circuits B and C.

In this state the circuits A and B can be tuned or made to resonate at frequencies over the lower VHF band by adjustment of the voltage across respectively the varactors 28 and 88. Similarly the tuned circuit C can be tuned or made to resonate at frequencies above those in the lower VHF range by the IF, the intermediate frequency.

The tuning voltage is selected by adjustment of the source 282 and applied through the switch 274, via its first contact 274A, to the first tuning voltage terminal 371 of the unit 14. As this terminal is electrically connected to the tuning voltage input terminal 37 of the VHF tuner 10, this tuning voltage is supplied simultaneously to one end of each of three current limiting or isolation resistors 36, 96 and 236 and through these resistors to the cathodes of the varactors 28, 88 and 228. As these varactors are back-biased diodes only a small current flows through them and consequently the voltage drop across each of the resistors 36, 96 and 236 is negligible. Thus, the tuning voltage from source 282 can be considered as being applied directly to the varactors. For direct current analysis the anodes of the varactors 28, 88 and 228 can be considered to be a DC ground potential through their associated inductors, respectively coils 24T, 72S and 224. Thus the DC potential across each of the varactors 28, 88 and 228 and consequently its capacitance is directly determined by the tuning voltage source 282.

With the ganged switches 271–274 in their first positions there is no B+ voltage, AGC voltage or tuning voltage applied to the UHF tuner no signal is supplied from it to the UHF IF input terminal 250 of the VHF tuner. Also as the B+ positive potential is applied through the switch 272, to the terminal 80 and thus, through line 74 and resistor 254 to the anode of the diode 255, that diode is forward biased to substantially ground out any signal present at terminal 250.

With this understanding of the condition of the system and the tuner 10 we can now follow the processing of a received lower band VHF channel signal through the tuner 10. Such a signal impressed on the antenna input terminal 16 is translated through the balum 18 and the trap circuits 20 to the transformer 24. The preselector tuned circuit A, if the tuning voltage and thus the capacitance of the varactor 28 is adjusted properly, will emphasize the particular channel signal selected and attenuate the non-selected channel signals. This emphasized or preselected channel signal is coupled via the coil 24S to the RF amplifier where it is amplified and impressed on the transformer 72. The second or interstage tuned circuit B, tracks or follows the tuning of the circuit A as both are adjusted by the same voltage. This circuit B further emphasizes the selected channel signal and attenuates or shunts out those signals outside of the selected channel. The amplified and selected channel signal is coupled via the additional secondary coil 72T of the transformer 72 through the capacitor 110 to the emitter of mixer transistor 120.

At the same time the oscillator circuit is producing an unmodulated signal at a frequency equal to the selected channel's carrier frequency plus the intermediate frequency. This is true regardless of the channel selected as the output frequency of the oscillator is determined by the effective capacitance of the varactor 228 which is determined by the same tuning voltage as the circuits A and B. The circuit values of the circuit C are chosen so as to have its resonant frequency be at all times equal to the resonant frequency of the circuit A and B plus the single predetermined value of the intermediate frequency. Thus as the tuning voltage is varied over its range the resonant frequency of the tuned circuits A and B range over the range of channels 2–6 while the resonance frequency of the circuit C tracks along at a frequency equal to the resonant frequencies plus the intermediate frequency.

The oscillator output and the output from the tuned amplifier including the transistor 60 are mixed together in the mixer stage and a difference signal containing the modulation of the channel signal upon the IF signal carrier is derived. This difference signal is coupled through the IF band pass filter including the capacitor 134, the inductor 136 and the capacitor 152, to the IF amplifier transistor 150. The modulated IF signal is there amplified and coupled to the IF Out terminal through the transformer 172.

THE UPPER VHF BAND

In this mode of operation the ganged switch blades of the switches 271–274 are moved to their second positions to make contact with the second contact terminals 271B–274B. In this arrangement exactly the same voltages are applied to the outputs of unit 14 as in the case of the lower VHF range except for the switching voltage output terminal 48'. In this case the positive B+ potential is directly applied to terminal 48' from the contact 271B. (There is some current flow through the large resistor 284 to the negative B− potential source but this current is small and can be ignored as it does not affect the operation of the remainder of the circuit).

The application of the B+ potential to the terminal 48' and thus to the switching voltage input terminal 48 of the VHF tuner 10 results in the forward biasing of the diodes 30, 90 and 230. This results in the inductor 40, trimmer capacitor 38 and feedthrough capacitor 44 to be electrically part of circuit A and, similarly, adds the inductor 100, the trimmer capacitor 98 and the feedthrough capacitor 104 to the tuned circuit B and the inductor 240, the trimmer capacitor 238 and feedthrough capacitor 244 to the tuned circuit C.

The dominant effect of these additions to the circuits A, B and C is the addition of an inductance in parallel with the inductances already present in those circuits. The effect of this is to radically shift the resonant frequency range upward to the upper VHF band to cover channels 7–13. Thus, the tuning voltage level from the source 282 provides tuning over the channels 7–13 in the same manner as in the lower VHF band operation.

THE UHF BAND

In this mode of operation the ganged switch blades of the switches 271–274 are moved to their third positions to make contact with the contact points 271C–274C. This removes the B+ potential from the switching voltage output terminal 48' of the unit 14 and restores the negative bias thereto. It also removes the positive B+ voltage from the bias output terminal 80' at the unit 14 and thus from the input 80 of the VHF tuner 10 and instead applies this B+ voltage to the output terminals 283 and 180'. This results in B+ voltage being applied to the UHF tuner 12 and also to the line 174 of the VHF tuner 10.

The movement to the third contact 273C of the third switch 273 results in the AGC signal no longer being applied to the AGC input terminal 70 of the VHF tuner 10 but instead being applied to AGC input of the UHF tuner 12.

Because the B+ potential is no longer applied to line 74 of the VHF tuner 10 the RF amplifier transistor 60 is biased into its non-conducting state thereby effectively isolating the VHF antenna input circuitry from the remainder of the VHF tuner. Similarly, the removal of the B+ potential from the input 80 biases the oscillator transistor 190 into its non-conducting state and effectively removes the oscillator from the circuit.

The change in the B+ bias in the VHF tuner 10 further changes the bias on the diode 255 so as to allow any UHF derived IF signal that is present at the input terminal 250 to be translated through the coil 73T to the capacitor 110 to the emitter of the transistor 120.

Similarly the movement of the switch blade of the fourth switch 274 to its third contact 274C removes the tuning voltage from the VHF tuner 10 and applies it to the UHF tuner 12 via the output terminal 287.

The application of the B+ voltage, the AGC signal and the tuning voltage to the UHF tuner 12 activates that tuner to tune and translate received signals impressed upon its antenna inputs (not shown) and to produce an IF signal modulated with the information corresponding to a received and tuned UHF channel signal at its IF OUT terminal. This signal is impressed upon the UHF IF input terminal 250.

The mixer transistor 120 and the IF amplifier transistor 150 are kept biased into the conduction state as the B+ bias input terminal 132 remains connected to a B+ source. Thus, these two stages now function as a pair of cascaded IF amplifiers to amplify the UHF derived IF signal. This amplified signal is then coupled from the cascaded amplifiers to the IF Output terminal of the tuner 10 through the transformer 172.

Thus, for both VHF and UHF modes of operation the resulting modulated intermediate frequency signals are produced at the IF terminal of the tuner 10.

In order to achieve a parity of signal amplitude between the UHF derived and the VHF derived modulated intermediate frequencies the direct current biasing of the base of the IF amplifier transistor is altered during the UHF mode of operation by means of the resistor 164. With respect to the particular UHF tuner 12 of the aforementioned Manicki application this change is achieved by making the values of the resistors such as to increase the amplification of the transistor 150 during the VHF Mode.

FIG. 2 EMBODIMENT

Figure 2:
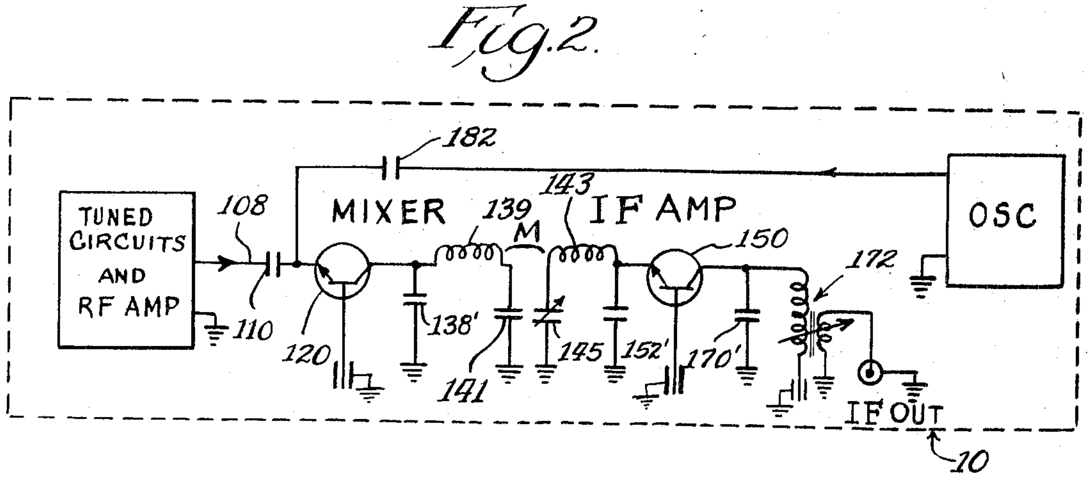
FIG. 2 is a circuit diagram partly in block of an alternative construction for the VHF tuner portion of the tuning system of FIG. 1.

Referring now to FIG. 2 there is depicted an alternative construction for the Mixer and IF Amplifier stages of the VHF tuner 10. In this case the portions of the VHF tuner 10 that are altered are depicted in detail, it being understood that the construction of the input, the preselector and RF interstage tuned circuits, the RF amplifier and oscillator stages, controls and interconnections is identical to that of FIG. 1. For convenience in representation the direct current operating bias establishing resistances have also been eliminated from this simplified circuit diagram.

In this embodiment the collector of the transistor 120 is connected to ground through a capacitor 138' and is also connected to one end of an inductor 139 whose other end is connected to ground through another capacitor 141. The inductance coil 139 is inductively coupled to a second coil 143 which has one end connected to ground through a variable capacitor 145 and its other end connected to the emitter of the IF amplifier transistor 150. The emitter of the transistor 150 is also connected to ground through the capacitor 152'. The collector of the transistor 150 is connected to one end of the primary coil of the IF output transformer 172 and also through a capacitor 170' to ground.

The capacitors 138' and 152' and 170' may be of the conventional type as depicted in FIG. 2 or could be of the feedthrough type as the feedthrough capacitors 138, 152 and 170 of FIG. 1.

In overall operation, the circuit of FIG. 2 functions in the same general manner as that of FIG. 1. That is, the IF signal produced in or translated through the mixer transistor 120 is developed at the IF Output terminal. More specifically, however, this circuit differs in its operation in that the IF signal is coupled from the inductance coil 139 to the inductance coil 143 and hence to the IF amplifier transistor 150.

The inductor 139 and capacitor 141 comprises a first tuned circuit while the second inductance 143 and its associated capacitors comprise a second tuned circuit. Both of these tuned circuits are band pass filters centered at the intermediate frequency with the appropriate band pass characteristics to pass the modulated IF signal, however, the provision of two such circuits provides greater selectivity without loss of band width. This results in a higher quality signal output at the IF output terminal and materially decreases cross-modulation.

FIG. 3 EMBODIMENT

Figure 3:
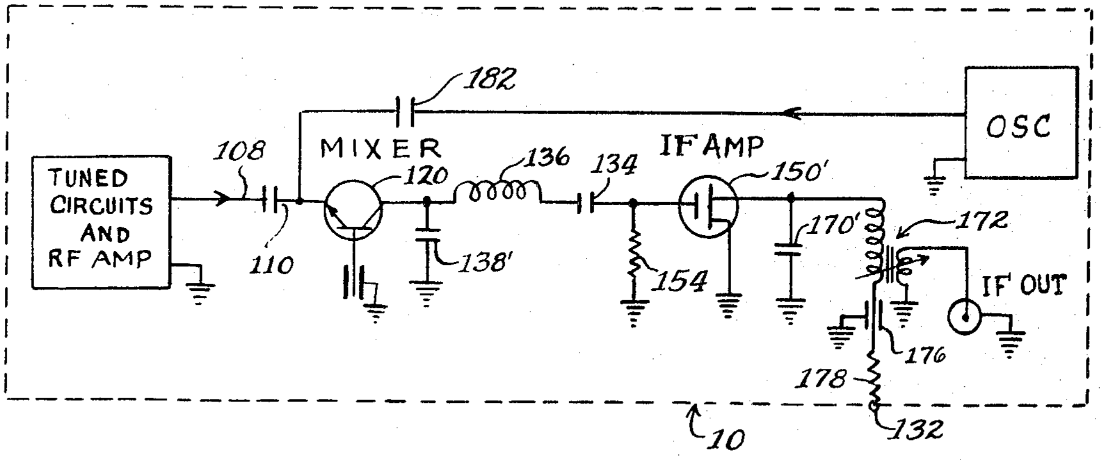
FIG. 3 is a circuit diagram partly in block form of another alternative construction for the VHF tuners depicted in FIGS. 1 and 2.

Another embodiment providing a high quality output with reduced cross-modulation is depicted in FIG. 3. This embodiment is, like that of FIG. 2, an alternative to the Mixer-IF Amplifier circuitry of FIG. 1. Also similar to the FIG. 2 diagram of the circuit, that of FIG. 3 is in skeleton form with it being understood that it is constructed and connected as was the tuner 10 of FIG. 1 except for the variations shown.

In this embodiment, a single tuned interstage circuit comprising a capacitor 138' connected between the collector of the transistor 120, and ground, an inductor connected from the collector of transistor 120 and one side of a capacitor 134 and a resistor 154 connected from the other side of the capacitor 134 to ground, is provided. The junction between the capacitor 134 and the resistor 154 is connected to the gate of field effect transistor (FET) 150' whose source and drain electrodes are respectively connected to ground and to the primary coil of the IF output transformer 172.

FIG. 4 EMBODIMENT

Figure 4:
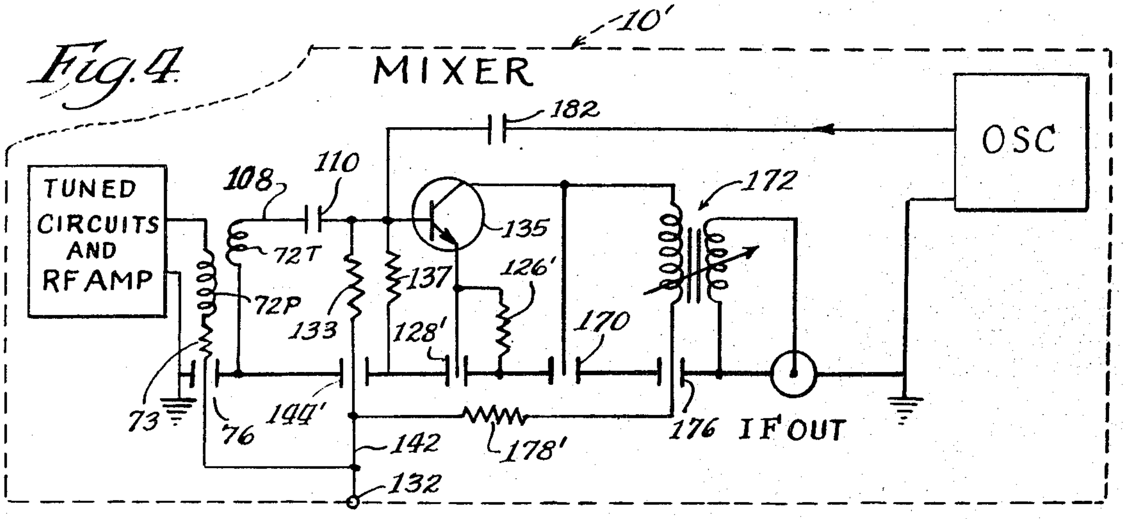
FIG. 4 is a circuit diagram partially in block form of yet another embodiment of a VHF tuner constructed in accordance with the present invention.

Referring to FIG. 4 there is depicted a simplified version of the tuner 10 of FIG. 1, which is here designated 10'. This tuner 10' has the same tuned circuits A and B and RF amplifier as that of the tuner 10 and these are therefore represented in block form in FIG. 4. Similarly the oscillator circuit and its tuned circuit C are the same as the tuner 10 of FIG. 1 and this is similarly indicated in block form.

The VHF tuner 10' is a three circuit three stage tuner without provision for processing a UHF derived signal. As such the need for switching of bias potentials for the UHF mode is eliminated and the bias input may be connected permanently to the bias input terminal 132. The mixer stage MIXER of the tuner 10' includes only one active circuit element, a NPN transistor 135 whose base is coupled to the inputs from the RF amplifier, through the capacitor 110, and from the oscillator, through the capacitor 182. The bottom of the second secondary coil 72T is grounded directly in the tuner 10' rather than through a diode or in the embodiment of FIG. 1, and the UHF–IF input circuitry including the input terminal 250, the traps 251, the diode 255 and the resistor 254 are eliminated.

The base of the transistor 135 is further connected to ground through a resistor 137, through a resistor 133 and a feedthrough capacitor 144'. It is also connected to the positive direct current input terminal 132 through the resistor 133, control inductor of the feedthrough capacitor 144' and a conductor line 142. The emitter of the transistor 135 is connected through the parallel circuit connection of feedthrough capacitor 128' and a resistor 126' to ground.

The collector of the transistor 135 is connected to one end of the primary coil of the IF output transformer 172 and is thus coupled through its secondary to the IF output terminal. In a manner similar to that of the tuner 10 of FIG. 1 the other end of the primary coil of the transformer 172 is connected through a feedthrough capacitor 76 to ground and to one end of a resistor 178' whose other end is connected to the B+ input terminal 132.

In operation the tuner 10' of FIG. 4 functions generally similar to that of the tuner 10 of FIG. 1 during its VHF mode of operation and the operation of its preselector circuit A, RF amplifier circuit and interstage tuned circuit B as well as of that of the oscillator circuit including its tuned circuit C is identical to that of the tuner 10 for both the high and low VHF bands of operation. In both of these bands the mixer stage of the tuner 10' of FIG. 4 accepts both the RF signal and the oscillator signal at the base of the transistor 135 mixes these signals and the resulting difference modulated IF signal is impressed upon the transformer 172. The emitter of the transistor is effectively at ground for radio frequency signals and the output circuit of the capacitor 170 and the effective inductance of the primary coil of transformer 172 constitutes a load circuit tuned to the IF frequency but shunting out the RF, oscillator and sum signals. Thus, only the modulated IF signal is developed at the IF output terminal.

This latter tuner 10' although not having provisions for UHF–IF processing illustrates one advantage of the three circuit construction of the present invention, that is the economy of parts and consequently the economy of production efforts that can be achieved. The use of a single tuned interstage circuit eliminated the need for a fourth varactor and its associated inductive and biasing circuitry simplifies the construction of the tuner 10 and 10'. The three circuit-three transistor VHF tuner 10' constitutes an economy tuner having high quality features.

FIG. 5 EMBODIMENT

Figure 5:
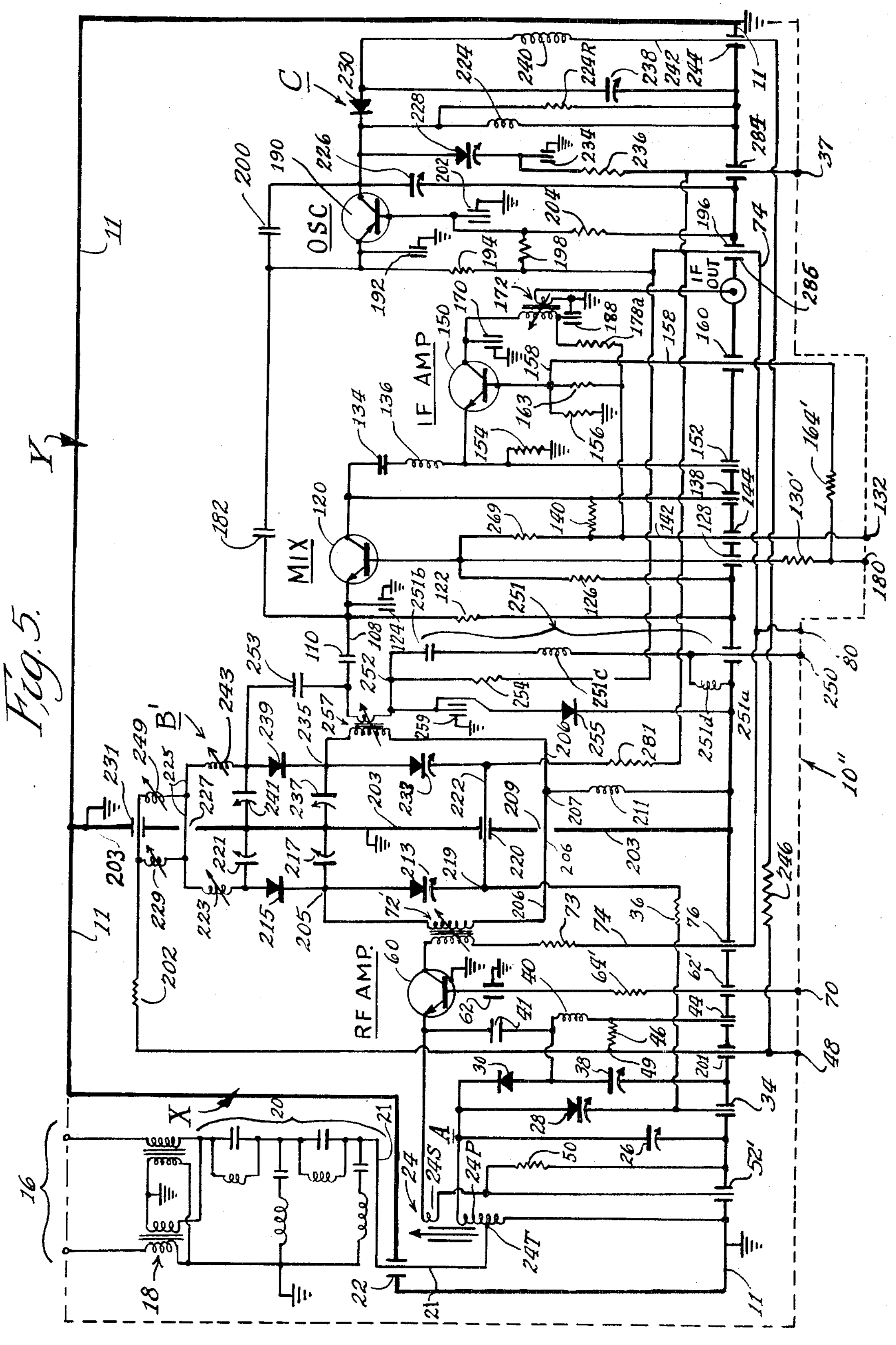
FIG. 5 is a circuit diagram of still another embodiment of a VHF tuner constructed in accordance with the present invention for use in the tuner system of FIG. 1.

Referring to FIG. 5, there is depicted a VHF television tuner which is generally designated by the numeral 10''. The tuner 10'' is designed to be circuit connected in place of the VHF tuner 10 in the system 9 of FIG. 1. That is, the tuner 10'' has inputs 16, 48, 70, 250, 80, 180, 132 and 37, as well as an IF OUT terminal. The VHF tuner 10'' is housed in a manner generally similar to that of the tuner 10, that is, it primarily is in a closed and compartmentalized housing with some elements mounted on the outside of the housing. The housing is again to be taken as "ground" or reference potential and is generally indicated by the numeral 11. The housing 11 is further divided into two essentially closed volumes, zones or cavities, by a central interior wall, 203, which zones or cavities are generally designated X for the right-hand cavity and Y for the left-hand cavity as in FIG. 5. Generally, each circuit element found within the zone X or Y is housed in the physical housing 11 in that cavity, however, many components could be physically rearranged without affecting the electrical properties of the circuitry and occasionally a feedthrough capacitor that passed through the housing is depicted removed from the housing line 11 for clarity in the drawing.

In general, the tuner 10'' contains many parts and operates in a manner similar to that of tuner 10 of FIG. 1. Therefore, only the differences will be here discussed in detail, reference being made to the discussion above in connection with FIG. 1 for more detail.

The tuner 10'' includes a pair of VHF antenna input terminals 16 connected to an impedance matching transformer or balum 18 which is shown in more detail than in the previous embodiments. The ratio frequency signals picked up by the antenna or otherwise impressed on the input terminals 16 are developed between the output of the balum 18 and the plane of reference potential or ground. These signals are passed through an FM and IF trap circuit generally designated 20. The received VHF signals are fed into the housing of the tuner 10 via a line 21 which passes through a feedthrough capacitor 22 to a preselector tuned circuit generally designated by the letter A.

This circuit A, which is similar to the circuit A of the tuner 10 of FIG. 1, includes a first transformer 24 which has a primary coil 24P and a secondary coil 24S. The primary coil 24P has an intermediate tap 24T to which is connected the incoming VHF signal line 21. One end of the coil 24P is grounded while the other end is connected in common with one side of a trimmer capacitor 26, with the anode of a solid state voltage variable capacitor 28 which is of the variable capacitance diode or varactor type, and with the cathode of a switching diode 30. The transformer 24 is preferably wound on a single core, as shown, with a movable monulerium core.

The other side of the trimmer capacitor 26 is grounded. The cathode of the varactor 28 is connected through a capacitor 34 of the feedthrough type, to ground. A resistor 36, here mounted within the housing 11 of the tuner 10'', is connected to the junction between the varactor 28 and the capacitor 34. The other end of resistor 36 is connected, ultimately, to tuning voltage input 37 in a manner that will be explained more fully later.

The anode of the diode 30 is connected through a trimmer capacitor 38 to ground and also to one end of an inductance coil 40. The other end of the coil 40 is connected through a feedthrough capacitor 44 to ground. The junction between the capacitor 44 and the coil 40 is connected through a resistor 46 to a junction point 49. This junction 49 is connected through a feedthrough capacitor 201 to ground and also through the center conductor of the feedthrough capacitor 201 to a switching voltage input terminal 48 without of the housing 11. The voltage present at the input terminal 48 is also connected through a resistor 202 from the junction point 49 to an interstage circuit B'.

The secondary coil 24S of the transformer 24 has one end connected through a resistor 50 to ground which is connected in parallel with a capacitor 52' of the feedthrough type which is also connected to ground. The other end of secondary coil 24S is connected to the emitter of an NPN radio frequency transistor 60. The resistor 50 functions to establish the direct current operating potential for the emitter of the transistor 60.

The transistor 60 is the amplifying device of the radio frequency amplifier stage RF AMP of the tuner 10''. Also provided connected to the emitter of the transistor 60 is a high band injection capacitor 41 connecting the emitter with the high end, that is, the end of the coil 40 connected to the cathode of the switching diode 30. This capacitor 41 serves to increase the coupling of the selected high band signals when the diode 30 is conductive. This high band increased coupling capacitor was not employed in the tuner 10 of FIG. 1. The transistor 60 is operated in the grounded base configuration with its base connected to radio frequency ground through a capacitor 62 again of the feedthrough type. The gain of the RF amplifier is controlled by a direct current bias applied to the base of the transistor 60. This bias is applied through the terminal 70 which is connected to the center conductor of the capacitor 62' and thus through a resistor 64' to the base of the transistor 60.

The transistor 60 preferably has a metal shield which is grounded. The collector of the transistor 60 is connected to one end of the primary coil of a movable core variable transformer 72'. The other end of the primary coil is connected through a current limiting resistor 73 to a line 74 which passes without the housing of the tuner 10 through a feedthrough capacitor 76. The line 74 is electrically connected to the positive direct current bias input terminal 80. The resistor 73 also functions to establish the DC operating bias level for the transistor 60.

The circuit B' is double tuned and is preferably housed in two different compartments or cavities X, Y of the closed housing. The cavities X, Y are separated by a grounded interior wall symbolically indicated in FIG. 5 by the line 203. As stated above, the circuit B' is, unlike the circuit B of FIG. 1, double tuned, that is, it includes two tuned circuits having slightly differing or offset resonant frequencies (at any tuning voltage) so as to present a better and more uniform band pass response to the relatively wide band of signals present in any selected or tuned television channel.

The circuit B' includes the single secondary of the transformer 72 which secondary has one end connected to a circuit junction point 205 and its other end connected via a conductor line 206, through an opening 209 the wall 203 from the cavity X, to a junction point 207 in the second cavity Y. The line 206 passes through the wall 203 preferably by means of a wire through the center of a tapered cylindrical plug of insulation material, such as rubber, that is inserted into an appropriately sized hole in the wall. Such plugs, with conductors inserted, are commonly used in the tuner art and are often termed "tie points." Although tie points are sometimes schematically depicted by a pair of curving lines similar in general appearance to those used in schematically depicting a feedthrough capacitor and indeed in physical appearance such tie points resemble a feedthrough capacitor which also passes through a wall, such tie points should not be confused with the capacitor circuit element. Ideally, such tie points are without electrical circuit significance. Connected within the cavity X between the junction point 207 and ground is an inductor 211.

Connected to the point 205 in the cavity Y is the anode of a solid state voltage variable capacitor 213 of the varactor diode type, the cathode of a solid state switching device 215 of the diode type and also one side of a trimmer capacitor 217. The other side of the trimmer capacitor 217 is grounded to the wall 203, the anode of the varactor 213 is connected to a circuit junction point 219 and the cathode of the switching diode 215 is connected through a trimmer capacitor 221 to ground and also to one end of an inductor 223. The junction point 219 is connected to the varactor tuning voltage input 37 through the center conductor 222 222 of a feedthrough capacitor 220 which passes through the wall 203, and is also connected to the resistor 36.

The other end of the inductor 223 is connected to a line 225 which passes from the cavity X through the grounded wall 223 through an opening 227, which may be of the tie point type, into the cavity Y. Also connected to this other end of the inductor 223 is another inductor 229. The end of the inductor 229 away from the line 225 is connected to the center conductor of a feedthrough capacitor 231 which passes through the grounded wall 203.

Also connected to the junction of the inductor 229, through the resistor 202 is the terminal 49 and ultimately the switching voltage input terminal 48.

The circuit B' so far described represents the first tuned circuit of the double circuit. This part of the circuit is substantially located in the cavity X on one side of the wall 203, while the second tuned circuit of the double tuned circuit B' is located on the opposite side of the wall 203 in the cavity Y. This second tuned circuit is in large part a mirror image of the first, including a varactor 233 corresponding to the varactor 213, and solid state means for switching 239, preferably as shown, of the switching diode type corresponding to the switching diode 215.

The anode of the varactor diode 231 is connected to a junction point 235 which in a manner analogous junction point 205 is connected through a trimmer capacitor 237 to the grounded wall 203 and to the cathode of a switching diode 239. The cathode of the diode 239 is similarly connected through another trimmer capacitor 241 to ground and through an inductor 243 to the line 225. The cathode of the varactor 231 is connected to the line 222 and also through a resistor 231 and the central connector of a feedthrough capacitor 284 to the tuning voltage input terminal 37.

In addition, this second tuned circuit of the double tuned circuit B' includes an inductance coil 243 connected between anode of the diode 239 and the line 225, and an inductance coil 249 connected between the diode 225 and the central conductor of the feedthrough conductor 231. Furthermore, connected as an analogue to the secondary of the transformed 72' is the primary of another transformer 257. The transformer 257 is preferably of the movable core type and has its primary coil connected between the circuit junction points 235 and 207.

The secondary of the transformer 257 performs the same circuit function as the second secondary 72T of the tuner 10 of FIG. 1. For additional coupling or injection of the selected channel signals for the high VHF band channels, a capacitor 253 is provided from one end of the secondary of the transformer 257 and the common junction of the switching diode 239, the capacitor 241, and the inductor 243. The other side of the secondary of the transformer 257 is, as in the previous embodiments, connected to the anode of a diode 255 whose cathode is connected to ground. In addition, this side of the secondary is also connected through a feedthrough capacitor 259 to ground. This capacitor 259 is not present in the embodiment of FIG. 1.

As in the previous embodiment, the output of the RF amplifier including the transistor 60 and the double tuned load circuit B' is connected to a mixer circuit from the secondary inductor of the transformer 257, via a line 108 and through a capacitor 110, to the emitter of a mixer NPN transistor 120.

The mixer transistor 120 has its emitter further connected through a biasing resistor 122 to ground and also through capacitor 124 to ground. The capacitor 124 can be of the feedthrough type. The base of transistor 120 is connected through a first resistor 126 to ground and through a feedthrough capacitor 128 to one side of a second resistor 130' mounted outside of the housing. The other side of the resistor 130' is connected to the bias potential input terminal 180.

The collector of the mixer transistor 120 is connected through a filter circuit including series connected capacitor 134 and inductor 136 to the emitter of an IF amplifier NPN transistor 150. The collector of the transistor 120 is also connected to ground through a capacitor 138 of the feedthrough type and to the B+ input terminal 132 through a resistor 140 and a line 142 which passes through the housing via a feedthrough capacitor 144. The base of the transistor 120 is also connected, within the housing, to the line 142 through a resistor 269.

The IF amplifier transistor 150 has its emitter connected to ground through the parallel connection of the capacitor 152 and a resistor 154. Its base is connected through a resistor 156 to ground and also through a resistor 163 to the line 142 and ultimately to the bias input 132. The base of transistor 150 is further connected to a line 158 which is connected through the central conductor of a feedthrough capacitor 160 to one end of a resistor 164' mounted outside the housing 11. The other end of this resistor 164' is connected to the input 180.

The collector of the IF amplifier transistor 150 is connected to ground through a capacitor 170 which may be of the feedthrough type, and is also connected to one end of the primary coil of a variable transformer 172. The other end of this primary coil of the transformer 172 is connected through a capacitor 188 to ground and through a resistor 178a to the line 142 and thus to the input terminal 132. The secondary coil of the transformer 172 has one end grounded and the other end connected to the intermediate frequency output terminal, IF OUT.

The transistor 120 of the mixer stage; MIX, also has a signal impressed in its emitter from an oscillator stage, OSC, which is virtually identical to the oscillator of the tuner 10 of FIG. 1.

Thus, the oscillator signal is coupled through a capacitor 182 from the emitter of a PNP transistor 190. The emitter of the oscillator transistor 190 is also connected through a capacitor 192 to ground and through a resistor 194 and feedthrough capacitor 196 to ground and through the central conductor of the feedthrough capacitor 196 to the line 74 without the housing 11, to the B+ input terminal 80.

Also connected to the junction between the resistor 194 and the capacitor 196 is one end of a resistor 198 whose other end is connected to the base of the transistor 190. The base of this transistor is also connected to ground through the parallel connection of a capacitor 202 and a resistor 204. The capacitor 202 is preferably of the feedthrough type.

A feedback capacitor 200 is provided connected between the emitter and collector of the oscillator transistor 190. Also connected to the collector is the oscillator's frequency determining tuned circuit C. This circuit includes a trimmer capacitor 226 connected between the collector and ground, and a varactor 228 whose cathode is connected to the collector of the transistor 190 and whose anode is connected through a feedthrough capacitor 234 to ground and through a resistor 236 and the second feedthrough capacitor 284 to the outside of the housing 11 and the tuning voltage input terminal 37.

Also provided between the collector of the transistor 190 and ground is the parallel circuit connection of an inductance coil 224 and a resistor 224R. The cathode of a switching diode 230 is connected to the collector of the oscillator transistor 190. The anode of this diode 230 is connected through a trimmer capacitor 238 to ground and is also connected to one end of an inductance coil 240. The other end of this coil 240 is connected to a conductor 242 which passes through a feedthrough capacitor 244 and is connected to one end of a resistor 246 mounted outside the housing 11. The other end of this resistor 246 is connected to the switching voltage input terminal 48.

Further provided in the tuner 10'' are provisions for accepting a UHF intermediate frequency signal, including the UHF intermediate frequency input terminal 250 which is connected through an intermediate frequency band pass filter circuit, generally designated 251 to a junction point 252. This filter 251 is mounted inside the housing 11 in this embodiment and includes a feedthrough capacitor *251a*. This filter 250 also includes a capacitor *251b* connected between the junction 252 and one side of an inductance coil *251c* whose other side is connected in common to the center conductor of the feedthrough capacitor *251a* and also to one end of an inductance coil *251d* whose other end is grounded.

The junction point 252 is connected through a resistor 254 to the bias line 74 and also to the bottom end of the secondary coil of the transformer 257. This junction point 252 is further connected to the anode of a diode 255 whose cathode is grounded. During the VHF mode of operation, the diode 255 is biased into conduction and thus grounds the bottom of the coil 72T.

It might well be noted at this point that the feedthrough capacitors 124, 170, 188, 202, 259 and 234, although depicted for convenience remote from the housing line 11 in FIG. 5, are actually mounted through the housing in the physical embodiment. In practice, the feedthrough capacitors at the bases of transistors such as the transistors 190, 150, 120 or 60 which are in the "grounded base" configuration are physically positioned as close as possible to the base to eliminate, as much as is possible, the lead inductance that would otherwise be present. Thus the symbolism of having the feedthrough capacitor, such as the capacitor 202, depicted adjacent to the base. In connection herewith, it might also be noted that one conventional notation of those skilled in this art is to ignore for the primarily direct current components (such as the resistor 236 which provides the direct current biasing for the varactor 228) the distinction between the different sides of the central conductor of a feedthrough capacitor. This notation is followed with respect to the feedthrough capacitor 62 at the base of the transistor 60. Thus for direct current circuit analysis it is immaterial whether or not the resistor is joined to the central conductor of the capacitor at its end connected, for example, to varactor diode or to the other end of the central conductor. Therefore, some circuit diagrams will depict, for convenience, a resistor connected to a terminal where it would not be connected in the physical circuit.

It should also be noted at this point that the capacitance tuned circuits A and C and the two tuned circuits of B' of the tuner 10'' are substantial electrical homogens of one another. That is, they are substantially alike in electrical structure.

OPERATION OF FIGURE 5 EMBODIMENT

The over-all operation of the tuner 10'' is the same as that of the tuner 10 of FIG. 1 and it operates as part of the tuner system 9 in substantially the same manner as the tuner 10. It differs therefrom in operation primarily in the manner in which the interstage tuned circuit B' functions and in the adjustment in operating amplification level that occurs in UHF mode operation.

Thus, in either high or low band VHF operation the RF signals selected and amplified by the preselector circuit A and the amplifier circuit RF AMP including the transistor 60 are coupled to the double tuned circuit B' through the transformer 72'. The signal developed in the secondary of the transformer 72' and the first tuned section of the circuit B' is coupled to the second tuned circuit of circuit B' by the inductor 211, which is common to both tuned circuits of the circuit B'. The sections are tuned by the solid state voltage variable capacitors 213 and 233 which are controlled by a common direct current potential applied to their respective cathodes. Both the varactors 213 and 233 have their cathodes connected together through the central conductor 222 of the feedthrough capacitor 220 and to the tuning voltage input 37 via the resistor 231. The anodes of these two diodes 213 and 231 are, as far as direct current analysis is concerned, at direct current ground potential by, respectively, the path through the junction point 205, the secondary inductor of the transformer 72' and the coil 211; and the junction point 235, the primary of the transformer 257 and the coil 211. Thus, whatever direct current potential is present at line 222 is applied directly across these two tuning varactor diodes 213 and 233 to determine their effective capacitances.

In the low band operation the switching diodes 215 and 239 are back-biased to effectively remove the inductor 223, 229, 243 and 249, as well as the trimmer capacitors 221 and 225 from the tuned circuit B'. These diodes 215 and 239 are controlled in common by the direct current potential applied from the input 48 through the conductor of the feedthrough capacitor 201 via the junction point 49, the resistor 202, the coil 229, the line 225 and the coils 223 and 243, as well as through the feedthrough of the capacitor 231 and the coil 249 to the line 225 and then through the coils 223 and 243, to, respectively, the anodes of the diodes 215 and 239. The cathodes of these two diodes are effective at ground potential as far as direct current analysis is concerned through the respective current paths of the junction 205, the secondary of the transformer 72', the line 206, the junction 207 and the coil 211; and the junction 235, the primary of the transformer 257, the line 206, the junction 207 and the coil 211. Thus whatever direct current potential appears at the feedthrough line of the capacitor 231 is present across the diodes 215 and 239 or to determine their conductive or non-conductive state. When biased into their conductive state the direct current through the diodes 215 and 239 is kept low by the relatively large resistance of the resistor 202.

With the switching diodes 215 and 239 in their conductive state the circuits formed by the inductors 223, 229, 243 and 249 with the capacitors 221, 231 and 241 are added to the circuit B' for alternating circuit analysis purposes. The line 225 serves to additionally couple the two resonant circuits together in this mode of operation. Furthermore, in this high band mode, additional injection to the mixer of selected signals is obtained by the provision of the capacitor 253.

The remainder of the operation, that is, the operation of the Oscillator, Mixer and IF Amplifier during VHF modes, is the same as that in the tuner 10 explained above. When the system is operated in the UHF mode and the UHF tuner-derived IF signal is impressed upon the input 250, while the B+ input to the input 80, and the AGC and tuning voltages are removed from the inputs 20 and 37. In this mode, the input 132 still has the bias potential B+ applied to it and in addition negative bias is applied to the input 180.

The removal of bias from the terminal 80 biases the transistors 60 and 190 into non-operating states effectively removing the VHF input circuitry amplifier RF AMP and the oscillator OSC from the circuit. The presence of the B+ potential at terminals 132 and 180 maintains the transistors 120 and 150 biased into operation.

The effect of the application of bias to the line 180 is to place the resistor 130' in parallel circuit connection with the resistor 269 between the base of the transistor 120 and the positive bias B+. This has the effect of lowering the effective base to B+ resistance and raising the direct current bias level at the base. This bias level is determined principally by the voltage dividing circuit formed by the resistor 269 and the resistor 126 in the UHF mode. Similarly, the application of direct current positive bias to the terminal 180 places the resistor 164' in parallel with the resistor 163 thus decreasing the resistance exhibited between the base and B+ to raise the direct current bias level at the base of the transistor 150.

The effect of this change is to increase the amplification factor of the cascaded amplifiers formed by the transistors 120 and 150 and to increase the amplitude of the output UHF-derived IF signals above what it would be otherwise.

The tuner 10'' is capable of being used alone as a VHF tuner without provision for receiving a UHF derived IF signal. In this case the tuner 10'' would not need the resistors 130' and 164'.

Figure 6A:
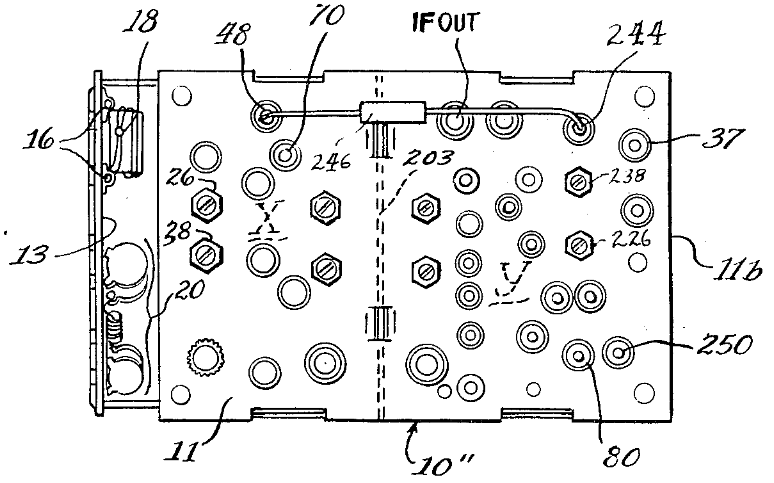
FIGS. 6A, 6B and 6C are respectively a plan view, a side elevational view, and an end elevational view of the VHF tuner of FIG. 5, illustrating the type of housing and construction for tuners constructed in accordance with the present invention.
Figure 6B:
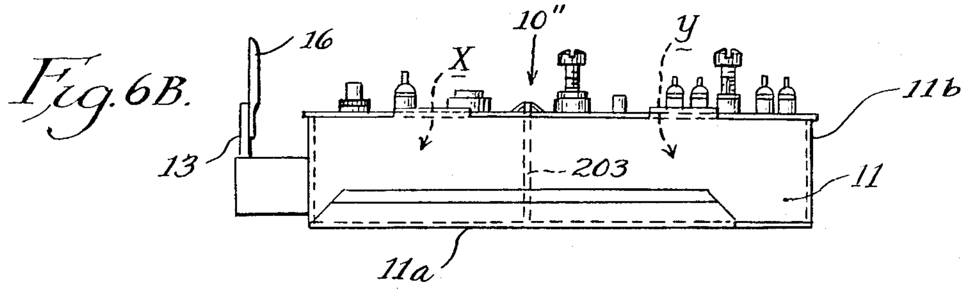
Figure 6C:
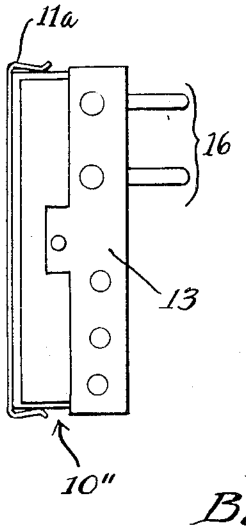

Referring now to FIGS. 6A, 6B and 6C, there is shown in pictorial form the VHF tuner 10''. As mentioned before, the tuner 10'' is primarily housed in a closed generally rectangular housing 11 whose closed interior space is divided into two zones or cavities X and Y by a dividing wall 203 which is in electrical contact as well as physical contact with the grounded housing 11. The housing 11 includes a removable outer wall or cover **11*a*** for providing access to the interior parts during assembly and testing, and also for repair.

The antenna inputs 16, as well as the ballum 10 and the trap circuits 20 are preferably mounted on the outside of the chassis in the tuner 10'', in part, on an insulated circuit board 13. As better detailed in the aforesaid Manicki application, the UHF tuner 12 may be conveniently mounted at one end of the VHF tuner housing 11 and employs an end wall thereof such as the wall **11*b* as part of its housing. The particular tuner depicted in FIGS. 6A, 6B and 6C is shown in the state for use without the UHF tuner in that the resistors 130' and 164' are not in place. However, it is an advantage of the present invention that the tuner 10'' can be quickly adapted for UHF IF translation by the simple steps of adding these resistors and correcting the UHF tuner unit, preferably at the wall 11*b***.

As an example of the space saving that can be achieved with the circuits of the present invention, a working model of a tuner made in accordance with the tuner 10'' of FIGS. 5, 6A, 6B and 6C was housed in a rectangular housing 3.562 inches long by 2.38 inches wide by 0.80 inch high and had over-all maximum dimensions, including projecting antenna input terminals and other projecting parts, of 4.062 inches long, by 2.38 inches wide by 1.30 inches high, to occupy a rectalinear space zone of less than 12.6 cubic inches. A conventional transistorized VHF turret tuner, such as are presently manufactured by the assignee of the present invention occupy a rectangular space of about 35 cubic inches. Even greater space savings can be achieved as in this model there remains much space between elements and no particular emphasis was placed upon making the unit compact but rather, convenience of assembly and construction was the primary dictator of its size and configuration. Those having ordinary skill in this art would be able to achieve such a smaller unit.

In constructing the tuners and tuner systems herein described, the following values for the parts listed are here included for purposes of providing a full and complete disclosure of the presently contemplated best mode of using the invention. However, these values are exemplary only and not submitted with any intent to limit the scope of the present invention. Other values, arrangements of components and different types of elements, as will be recognized by those skilled in the television tuner art, can as well be employed without departing from the principles of the present invention.

The following table illustrates such types or values for the embodiment of FIG. 1:

| ELEMENT | Type or Value |
|---|---|
| transistor **60** | BF200 |
| transistors **120** and **150** | MPS 6540 |
| transistor **190** | MPS 6580 |
| varactors **28, 88** and **228** | BA 142 (matched set) |
| diodes **30, 90, 230** and **255** | BA 136 |
| feedthrough capacitors **34, 44, 52, 68, 76, 94, 104, 128, 144, 160, 168, 190, 196, 202, 234** and **244** | 1 KpF |
| feedthrough capacitors **22, 124** and **192** | 6.8 pF |
| feedthrough capacitors **138** | 18 pF |
| feedthrough capacitors **152** | 47 pF |
| feedthrough capacitors **170** | 10 pF |
| trimmer capacitors **26, 38, 86, 96, 226** and **238** | 0.5 to 3 pF |
| capacitors **110** and **134** | 1 KpF |
| capacitor **182** | 2.2 pF |
| capacitor **200** | 1.5 pF |
| resistances **50, 64** | 330 Ohms |
| resistances **36** | 8.2 K Ohms |
| resistances **46, 250, 106, 246** | 1.5 K Ohms |
| resistances **73, 178** | 680 Ohms |
| resistance **96** | 27 K Ohms |
| resistance **122, 154** | 1 K Ohm |
| resistance **126, 140, 156** | 2.2 K Ohms |
| resistance **130, 236** | 10 K Ohms |
| resistance **166** | 5.6 K Ohms |
| resistance **164** | 18 K Ohms |
| resistance **194, 198** | 3.3 K Ohms |
| resistance **204** | 2.2 K Ohms |
| inductor **40** | 0.1 $\mu$ H |
| inductor **100** | 0.1 $\mu$ H |
| inductor **136** | 1.6 $\mu$ H |
| inductor **224** | 0.23 $\mu$ H |
| inductor **240** | 0.06 $\mu$ H |

Transformer 172 has a primary inductance in the approximate range of 0.65 $\mu$ H to 1.5 $\mu$ H and a secondary inductance in the approximate range of 0.1 $\mu$ H to 0.15 $\mu$ H. The transformer 24 is a movable iron core transformer having its primary tapped at three turns from ground potential and exhibiting an effective primary inductance of approximately 1.2 $\mu$ H and a secondary inductance of approximately 0.15 $\mu$ H. The transformer 72 is a bifilar winding with a primary and secondary inductance of approximately the ranges of 0.4 $\mu$ H to 0.75 $\mu$ H.

The coil 27T is formed by approximately three loops of wire wound about the secondary 27S and has an inductance range of about 0.08 to 0.1 $\mu$ H.

The direct current bias potential, B+, is of the order of 12 volts positive while the negative direct current bias potential B− is of the order of 12 volts negative.

In the alternative embodiment of FIG. 2 the following values are exemplary:

| | |
|---|---|
| capacitor **138'** | 18 pF |
| capacitors **141** and **152''** | 47 pF |
| capacitor **170'** | 10 pF |
| trimmer capacitor **147** | 2–10 pF |

The mutually coupled inductors 139 and 143 were wound on the same air core form and exhibited inductances of approximately 0.05 $\mu$ H and 0.05 $\mu$ H respectively.

In the embodiments of FIG. 3 the following values are exemplary:

| | |
|---|---|
| FET transistor **150'** | TSI 88 |
| capacitors **110** and **134** | 1 K pF |
| capacitor **138'** | 18 pF |
| capacitor **170'** | 10 pF |
| inductor **136** | 1.6 $\mu$ H |
| resistor **154** | 15 K Ohms |

In the embodiment of FIG. 4 the following values are exemplary:

| | |
|---|---|
| transistor **135** | SE 3005 |
| feedthrough capacitors **76, 144', 128'** | 1 K pF |
| feedthrough capacitor **170** | 15 K pF |
| feedthrough capacitor **176** | 39 K pF |
| resistors **133** | 3.3 K Ohms |
| resistor **137** | 1.5 K Ohms |
| resistor **126** | 1 K Ohms |
| resistor **178'** | 680 Ohms |

In the above three embodiments, the unlisted circuit element values remain unchanged from those of FIG. 1.

In the embodiment of FIG. 5 the following values are exemplary:

| | |
|---|---|
| transistor **60** | BF 200 |
| transistor **120** | MPS 6544 |
| transistor **150** | MPS 6540 |
| transistor **190** | MPS 6580 |
| varactors **28, 213, 231, 228** | BA 142 (Matched) |
| diodes **30, 215, 239, 230, 255** | BA 136 |
| feedthrough capacitors **124, 192, 251, 259** | 5 pF |
| feedthrough capacitors **34, 44, 52, 62, 68, 76, 128, 144, 160, 196, 201, 202, 220, 231, 235, 244** | 1 K pF |
| feedthrough capacitor **22** | 6.8 pF |
| feedthrough capacitor **170** | 10 pF |
| feedthrough capacitor **138** | 18 pF |
| feedthrough capacitor **234** | 24 pF |
| feedthrough capacitor **153, 178** | 47 pF |
| trimmer capacitors **26, 38, 217, 221, 226, 237, 238, 241** | 0.5–3.0 pF |
| capacitors **41, 253** | 1.0 pF |
| capacitor **200** | 1.5 pF |
| capacitor **182** | 3.3 pF |
| capacitors **110, 134, 251*b*** | 1000 pF |
| resistors **122, 154, 198** | 1.0 K Ohms |
| resistor **163** | 1.2 K Ohms |
| resistors **48, 126, 246, 254** | 1.5 K Ohms |
| resistors **140, 156, 194, 204** | 2.2 K Ohms |
| resistor **224R** | 8.2 K Ohms |
| resistors **36, 231, 236, 269** | 10 K Ohms |
| resistor **130'** | 12 K Ohms |
| resistor **164'** | 18 K Ohms |
| resistors **50, 64** | 330 Ohms |
| resistors **73, 178** | 680 Ohms |
| resistor **202** | 820 Ohms |
| inductors **229, 249** | 0.01 $\mu$ H |
| inductor **240** | 0.06 $\mu$ H |
| inductor **211** | 0.08 $\mu$ H |
| inductor **224** | 0.23 $\mu$ H |
| inductors **223, 243** | 0.1 $\mu$ H |
| inductor **40** | 0.1 $\mu$ H |
| inductor **251*d*** | 0.2 $\mu$ H |
| inductor **251*c*** | 1.0 $\mu$ H |
| inductor **136** | 1.6 $\mu$ H |

The inductors 229 and 249 are preferably formed by a tap upon the same coils that form respectively the inductors 223 and 243. That is, the line 225 is preferably a tap on a coil that forms the inductors 223 and 229 and is also a tap on a coil that forms the inductors 243 and 249. The tap is placed very close to the end of the coil, leaving only one turn or less for the inductors 229 and 249.

The above inductance values are approximate as the actual inductance is purposely left to be determined by spreading or "knifing" the open coils during the aligning process of the individual tuners. This has been found to be the most practical procedure when mass manufacturing these relatively high frequency devices.

The transformer 24 has a movable iron core and has its primary coil tapered at 24T at three turns from its grounded end. This transformer 24 exhibits an effective primary inductance in the range of 1.2 $\mu$ H and an effective secondary inductance in the range of 0.15 $\mu$ H. The transformer 72' is a bifilar winding transformer with a primary and secondary inductance of the approximate ranges of 0.4 $\mu$ H and 0.75 $\mu$ H. The transformer 257 has a primary in the approximate range of 0.45 $\mu$ H to 0.80 $\mu$ H and a secondary inductance in the approximate range of 0.08 $\mu$ H to 0.10 $\mu$ H. The IF output transformer 172 has a primary inductance in the approximate range of 0.65 $\mu$ H to 1.50 $\mu$ H and a secondary inductance in the range of 0.10 $\mu$ H to 0.15 $\mu$ H.

the above exemplary values are believed to be set forth accurately to reflect the values employed in actual working embodiments of the described tuners; however, normal care against unintentional error would dictate that these values should be mathematically and experimentally verified prior to use.

While particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention.

What is claimed as the invention is:

1. An all channel television tuning system (9) for selecting, translating and converting a received television signal into a modulated IF signal of a predetermined amplitude range, comprising:
   - a UHF television tuner (12) for selecting and converting a UHF television signal into a modulated IF signal of a first amplitude range having a power input, and an output at which the modulated IF signal is presented;
   - a VHF television tuner (10) having:
     - a housing (11),
     - a VHF television signal input into said housing,
     - a preselector solid state voltage variable capacitance tuned circuit (A) in said housing and coupled to said VHF television signal input,
     - an RF amplifier in said housing and coupled to said preselector tuned circuit for amplifying the signals emphasized thereby,
     - an interstage solid state voltage variable capacitance tuned circuit (B) in said housing coupled to said RF amplifier for emphasizing certain signals amplified thereby,
     - a mixer stage in said housing and coupled to said interstage tuned circuit and including an amplifier device (12),
     - an IF amplifier stage in said housing and coupled to said Mixer stage for amplifying the output therefrom and forming with said Mixer stage a cascaded amplifier,
     - an IF output from said housing coupled to the IF amplifier stage and at which the modulated IF signal of a predetermined range is presented,
     - an oscillator stage in said housing including an amplifier device (190) and an oscillator solid stage voltage variable capacitance tuned circuit (C) for producing an oscillatory signal, which signal is coupled to said mixer stage,
     - means for the input of tuning voltage into said housing, that input means being coupled within said housing to said preselector voltage variable capacitance tuned circuit, said interstage voltage variable capacitance tuned circuit and said oscillator voltage variable capacitance tuned circuit to apply selectively variable tuning voltage thereto and to thereby tune these three voltage variable capacitance-tuned circuits in common, and
     - power input means (80, 132, 180) to said housing for applying operating power thereto;
   - a source (282) of selectively variable tuning voltage;
   - means (274) for coupling said tuning voltage source to said tuning voltage input of said;
   - a power source;

means for selectively applying said power source to said VHF tuner while not applying it to said UHF tuner and alternatively, applying it to one part of said VHF tuner and said UHF tuner while not applying it to the rest of said VHF tuner; and means for selectively coupling said output of said UHF tuner to to said mixer stage of said VHF tuner thereby said mixer stage and said IF amplifier stage may alternatively serve to translate the UHF IF output signal to said IF output at the predetermined amplitude range, said VHF television tuner includes means for altering the overall gain of the cascaded amplifier formed by said mixer stage and said RF stage when the system is switched between VHF and UHF operation.

2. The all channel tuning system for selectively translating, and converting a received television signal into a modulated IF signal of a predetermined amplitude range as defined in claim 1, wherein:

said means for altering the overall gain comprises a first operating bias voltage input which forms part of said power input means and which is permanently connected to a source of direct current bias potential, and a second operating bias voltage input which is connected to a source of direct current bias potential only when said system is operated in its UHF mode of operation, and a voltage dividing network connected between said first input, said second input, ground potential and the IF amplifier device so as to establish one operating bias level for said IF amplifier device in VHF mode and another operating bias level in UHF mode.

3. The all channel tuning system for selecting, translating, and converting a received television signal into a modulated IF signal of a predetermined amplitude range as defined in claim 2 wherein:

said UHF tuner is a voltage-tuned tuner having a tuning voltage input; and said means for coupling said tuning voltage includes switching means for alternatively coupling said tuning voltage source with said VHF tuner tuning voltage input in the VHF mode of operation and with said UHF tuner tuning voltage input in the UHF mode of operation.

4. The all channel tuning system for selecting, translating and converting a received television signal into a modulated IF signal of a predetermined amplitude range as defined in claim 1, wherein:

a fourth solid stage voltage variable capacitance tuned circuit is provided between said RF amplifier and said mixer stage which fourth tuned circuit is coupled together with said interstage tuned circuit forming a double tuned circuit, said fourth tuned circuit being also coupled to said tuning voltage input of said VHF tuner for control thereby.

5. The all channel tuning system for selecting, translating and converting a received television signal into a modulated IF signal of a predetermined amplitude range as defined in claim 4 wherein:

each of said four VHF tuner tuned circuits, namely said preselector solid state voltage variable capacitance tuned circuit, said interstage solid state voltage variable capacitance tuned circuit, said fourth solid state voltage variable capacitance tuned circuit and said oscillator solid state voltage variable capacitance tuned circuit, are electrical homogens of each other;

said VHF tuner further includes a band switching voltage control input into said housing coupled to each of said four tuned circuits;

each of said four tuned circuits includes first inductance, solid state voltage controlled capacitor coupled to said first inductance, second inductance, and solid state means for switching said second inductance into and out of circuit with said first inductance whereby changing the operation frequency of said each tuner circuit from one band to another band, said switch means being coupled to said VHF band switching voltage control input for operation thereby; and the double tuned circuit formed by said interstage and said fourth tuned circuits has provision for injecting additional signals to said mixer stage during operation of said tuned circuits in one of the bands.

6. The all channel tuning system for selecting, translating and converting a received television signal into a modulated IF signal of a predetermined amplitude range as defined in claim 5 wherein:

said housing includes an internal shielding wall dividing the interior of said housing into a first and a second zone with said RF amplifier in said first zone and said oscillator in said second zone, with said interstage tuned circuit being substantially in said first zone and said fourth tuned circuit being substantially in said second zone; with said tuning voltage input being into one of said zones and being connected to the tuned circuits of the other zone by means of the connection between said interstage tuned circuit and said fourth tuned circuit.

7. The all channel tuning system for selecting, translating and converting a received television signal into a modulated IF signal of a predetermined amplitude range as defined in claim 1, wherein:

said means for altering the overall gain of the cascaded amplifier formed by said mixer stage and said IF stage when the system is switched between VHF and UHF operation, includes, as part of said power input means, a first operating bias input (132) which is connected to a source of operating bias in both VHF and UHF modes of operation of the system, and a second operating bias input (180) which is connected to operating bias in one of the VHF and UHF modes but not connected thereto in the other;

said first operating bias input having a first bias establishing resistive network (269,140,126,122) connected between it and said mixer amplifier and ground; and also a second operating bias establishing resistive network (**163,156,154,178*d*) between it and said IF amplifier device; and said operating bias second input having a first resistance (130') connected between it and said mixer amplifier device and a second resistance (164'**) connected between it and said IF amplifier, whereby said first and second operating bias establishing networks establish different operating bias for said mixer amplifier device and said IF amplifier when bias is connected to said second operating bias input.

8. An all channel television tuning system (9) for selecting, translating and converting a received television signal into a modulated IF signal of a predetermined amplitude range, comprising:

a UHF television tuner (12) for selecting and converting a UHF television signal into a modulated IF signal of a first amplitude range having a power input, and an output at which the modulated IF signal is presented:

a VHF television tuner (10) having:

a housing (11), a VHF television signal input into said housing, a preselector solid state voltage variable capacitance tuned circuit (A) in said housing and coupled to said VHF television signal input, an RF amplifier in said housing and coupled to said preselector tuned circuit for amplifying the signals emphasized thereby, an interstage solid state voltage variable capacitance tuned circuit (B) in said housing coupled to said RF amplifier for emphasizing certain signals amplified thereby, a mixer stage in said housing and coupled to said interstage tuned circuit and including an amplifier device (12), an IF amplifier stage in said housing and coupled to said Mixer stage for amplifying the output therefrom and forming with said Mixer stage a cascaded amplifier, an IF output from said housing coupled to the IF amplifier stage and at which the modulated IF signal of a predetermined range is presented, an oscillator stage in said housing including an amplifier device (190) and an oscillator solid state voltage variable capacitance tuned circuit (C) for producing an oscillatory signal, which signal is coupled to said mixer stage, means for the input of tuning voltage into said housing, that input means being coupled within said housing to said preselector voltage variable capacitance tuned circuit, said interstage voltage variable capacitance tuned circuit and said oscillator voltage variable capacitance tuned circuit to apply selectively variable tuning voltage thereto and to thereby tune these three voltage variable capacitance-tuned circuits in common, and power input means (80, 132, 180) to said housing for applying operating power thereto;

a source (282) of selectively variable tuning voltage;

means (274) for coupling said tuning voltage source to said tuning voltage input of said;

a power source;

means for selectively applying said power source to said VHF tuner while not applying it to said UHF tuner and alternatively, applying it to one part of said VHF tuner and said UHF tuner while not applying it to the rest of said VHF tuner; and means for selectively coupling said output of said UHF tuner to said mixer stage of said VHF tuner thereby said mixer stage and said IF amplifier stage may alternatively serve to translate the UHF IF output signal to said IF output at the predetermined amplitude range, said VHF tuner includes only three tuned circuits, being said preselector solid state voltage variable capacitance tuned circuit, said interstage solid state voltage variable capacitance tuned circuit and said oscillator solid state voltage variable capacitance tuned circuit, and each of said three tuned circuits are electrical homogens of each other.

9. The all channel tuning system for selecting, translating, and converting a received television signal into a modulated IF signal of a predetermined amplitude range as defined in claim 8, wherein:

said VHF tuner includes means for altering the overall gain of the cascaded amplifier formed by said mixer stage and said IF stage when the system is switched between VHF and UHF operation, said gain altering means comprising a pair of power inputs as part of said power input means and switching means for alternatively supplying and not supplying power to one of said pair of power inputs.

10. The all channel tuning system for selecting, translating, and converting a received television signal into a modulated IF signal of a predetermined amplitude range as defined in claim 9, wherein:

said VHF tuner further includes:

a band switching voltage control input into said housing, coupled to said three tuned circuits and each of said three tuned circuits includes a first inductance coupled permanently to said solid state voltage controlled capacitance and a second inductance that is effectively electrically coupled or decoupled in parallel to said first inductance in response to said band switching voltage by means of a solid state voltage responsive switch so that said three tuned circuits resonant frequencies are shifted between different VHF frequency bands;

a band switching voltage source, coupled to said band switch voltage control input of said VHF tuner, that selectively produces alternatively a first voltage signal to cause said solid state switch means to couple and a second voltage signal to cause said solid state switch means to decouple said second inductances into circuit with said first inductances; and said VHF tuner further includes as the means for coupling said mixer state to said interstage tuned circuit a coupling inductor inductively coupled to said first inductance of said interstage tuned circuit.

11. The all channel tuning system for selecting, translating and converting a received television signal into a modulated IF signal of a predetermined amplitude range as defined in claim 8, wherein:

said mixer stage and said IF amplifier stages are coupled together solely by means of inductive coupling between a first coupling inductance coil (139) connected in circuit with the amplifier device of said mixer stage and a second coupling inductance coil (143) connected in circuit with the amplifier device of said IF amplifier stage.

12. The all channel tuning system for selecting, translating and converting a received television signal into a modulated IF signal of a predetermined amplitude range as defined in claim 11 wherein:

said first coupling inductor forms part of a first fixed tuned circuit; and said second coupling inductor forms part of a second fixed tuned circuit, where both said circuits are tuned so as to form together a double tuned circuit to pass with approximately equal amplitude signals in the preselected IF signal band and to shunt out signals without that band.

13. The all channel tuning system for selecting, translating and converting a received television signal into a modulated IF signal of a predetermined amplitude range as defined in claim 8, wherein:

said amplifier device of said IF amplifier is a field effect transistor.

14. An all channel television tuning system (9) for selecting, translating and converting a received television signal into a modulated IF signal of a predetermined amplitude range, comprising:

a UHF television tuner (12) for selecting and converting a UHF television signal into a modulated IF signal of a first amplitude range having a power input, and an output at which the modulated IF signal is presented;

a VHF television tuner (10) having:

a housing (11), a VHF television signal input into said housing, a preselector solid state voltage variable capacitance tuned circuit (A) in said housing and coupled to said VHF television signal input.

an RF amplifier in said housing and coupled to said preselector tuned circuit for amplifying the signals emphasized thereby, an interstage solid state voltage variable capacitance tuned circuit (B) in said housing coupled to said RF amplifier for emphasizing certain signals amplified thereby, a mixer stage in said housing and coupled to said interstage tuned circuit and including an amplifier device (12), an IF amplifier stage in said housing and coupled to said Mixer stage for amplifying the output therefrom and forming with said Mixer stage a cascaded amplifier.

an IF output from said housing coupled to the IF amplifier stage and at which the modulated IF signal of a predetermined range is presented, an oscillator stage in said housing including an amplifier device (190) and an oscillator solid state voltage variable capacitance tuned circuit (C) for producing an oscillatory signal, which signal is coupled to said mixer stage, means for the input of tuning voltage into said housing, that input means being coupled within said housing to said preselector voltage variable capacitance tuned circuit, said interstage voltage variable capacitance tuned circuit and said oscillator voltage variable capacitance tuned circuit to apply selectively variable tuning voltage thereto and to thereby tune these three voltage variable capacitance-tuned circuits in common, and power input means (80, 132, 180) to said housing for applying operating power thereto;

a source (282) of selectively variable tuning voltage;

means (274) for coupling said tuning voltage source to said tuning voltage input of said;

a power source;

means for selectively applying said power source to said VHF tuner while not applying it to said UHF tuner and alternatively, applying it to one part of said VHF tuner and said UHF tuner while not applying it to the rest of said VHF tuner; and means for selectively coupling said output of said UHF tuner to said mixer stage of said VHF tuner thereby said mixer stage and said IF amplifier stage may alternatively serve to translate the UHF IF output signal to said IF output at the predetermined amplitude range, said system includes a source of AGC signals;

said UHF television tuner includes an AGC input; and means coupled to said source, and said AGC input for selectively switching the AGC signals between the UHF and VHF television tuners when said system is switched from operation between the UHF and VHF modes.

15. A VHF television tuner comprising:

a shielding housing;

an input into said housing for receiving impressed VHF television signals;

a capacitance tuned preselector tuned circuit in said housing coupled to said VHF television signals input for emphasizing signals in a selected channel portion of the VHF television signal range while attenuating signals and noise without of the selected channel portion;

a RF amplifier mounted in said housing including as its amplifying device a RF transistor, said transistor being inductively coupled to said preselector tuned circuit for amplifying the emphasized signals in the selected channel thereof and producing the amplified signals at an output;

a capacitance tuned interstage tuned circuit in said housing inductively coupled to the output of said RF housing inductively coupled to the output of said RF amplifier for receiving therefrom an amplified signal and for further emphasizing the signals of the selected channel and further attenuating signals and noise without of the selected channel;

a mixer in said housing including a mixer transistor primarily inductively coupled to said interstage tuned circuit for receiving therefrom the amplified and emphasized selected channel signals and mixing them with a local oscillatory signal;

a local oscillator in said housing for producing the local oscillatory signal, coupled to said mixer transistor and including a transistor and a capacitance tuned oscillator tuned circuit for determining the oscillatory frequency of said local oscillator;

a IF amplifier in said housing coupled to said mixer transistor through a IF filter circuit and including a transistor as its amplifying device, for amplifying the output of the mixer, an IF output from said housing inductively coupled to the IF amplifier transistor;

said preselector tuned circuit and said interstage tuned circuit and the oscillator tuned circuit of said local oscillator each comprising:

a first inductor, a solid state voltage variable capacitance diode connected in effective RF parallel circuit with said first inductor, a second inductor, and a switching diode connected between said second inductor and the junction of said first inductor and said capacitance diode for effectively adding or removing said second inductor from RF parallel circuit arrangement with said first inductor and said capacitance diode, with said solid state capacitance diode of each of said tuned circuits being matched to each other in electrical characteristics;

a tuning voltage input into said housing connected to said solid state voltage variable capacitance diode of each of said preselector, interstage and oscillator tuned circuits;

a switching voltage input into said housing connected to said switching diode of each of said preselector, interstage and oscillator tuned circuits, and means for connecting operating DC bias to said RF amplifier transistor, said mixer transistor, said IF amplifier transistor and said oscillator transistor, said VHF tuner including an IF input provided through said housing and coupled to said mixer transistor;

a switching diode provided in said housing for alternatively shutting out signals from the IF input or allowing those signals to reach said mixer transistor;

said operating DC bias means including first input means for establishing the operation bias for said RF amplifier transistor and said oscillator transistor and second input means for establishing the operational bias for said mixer transistor and said IF amplifier transistor, whereby said RF amplifier transistor and said oscillator transistor may be biased into a non-operable state when a signal is present at said IF input while said mixer and IF amplifier transistor are biased into operable state to amplify IF input signals from said IF input and to present the amplified signals at the IF output; and said operating DC bias means includes means for altering the amplification factor of said mixer and IF amplifier when said oscillator and RF amplifier are not operating.

* * * * *